(12) United States Patent
Chen et al.

(10) Patent No.: US 12,490,461 B2
(45) Date of Patent: Dec. 2, 2025

(54) DISPLAY PANEL AND DISPLAY DEVICE (71) Applicant: SHENZHEN CHINA STAR OPTOELECTRONICS SEMICONDUCTOR DISPLAY TECHNOLOGY CO., LTD, Shenzhen (CN)

(72) Inventors: Yuanpeng Chen, Shenzhen (CN); Yuanjun Hsu, Shenzhen (CN)

( * ) Notice: Subject to any disclaimer, the term of this patent is extended or adjusted under 35 U.S.C. 154(b) by 663 days.

(21) Appl. No.: 17/771,468

(22) PCT Filed: Apr. 20, 2022

(86) PCT No.: PCT/CN2022/087932
§ 371 (c)(1),
(2) Date: Apr. 24, 2022

(87) PCT Pub. No.: WO2023/184622
PCT Pub. Date: May 10, 2023

(65) Prior Publication Data
US 2023/0343837 A1    Oct. 26, 2023

(30) Foreign Application Priority Data
Apr. 2, 2022   (CN) .......................... 202210350183.4

(51) Int. Cl.
*H01L 29/76*       (2006.01)
*H10D 30/67*       (2025.01)
(52) U.S. Cl.
CPC ..... *H10D 30/6729* (2025.01); *H10D 30/6755* (2025.01)

(58) Field of Classification Search
CPC ........... H10D 30/6755; H10D 30/6713; H10D 30/6729; H10D 30/6757
See application file for complete search history.

(56) References Cited

U.S. PATENT DOCUMENTS 10,886,432 B2 *   1/2021   Kim ...................... H10D 86/451
2009/0050894 A1 * 2/2009   Park ................... H10D 86/0225
                                                    257/E21.414
(Continued)

FOREIGN PATENT DOCUMENTS

CN          102456743 A      5/2012
CN          104979380 A      10/2015
(Continued)

OTHER PUBLICATIONS

International Search Report in International application No. PCT/CN2022/087932,mailed on Nov. 25, 2022.
(Continued)

*Primary Examiner* — Ismail A Muse (57) ABSTRACT

The present application provides a display panel and a display device. The display panel comprises a substrate and a thin film transistor layer disposed on the substrate, wherein the thin film transistor layer comprises an active layer and a metal layer that are stacked, and the active layer comprises an active segment and a conductor segment connected to the active segment; and wherein the conductor segment comprises a lap portion connected to the metal layer and a conductor sub-segment between the lap portion and the active segment, and a groove is formed in the conductor sub-segment.

16 Claims, 6 Drawing Sheets

(56) References Cited

U.S. PATENT DOCUMENTS

| | | | |
|---|---|---|---|
| 2011/0024763 A1 | 2/2011 | Noda | |
| 2011/0127410 A1* | 6/2011 | Tanaka | H10F 30/28 |
| | | | 250/208.2 |
| 2012/0104397 A1* | 5/2012 | Choi | H10D 86/60 |
| | | | 438/151 |
| 2016/0049479 A1* | 2/2016 | Liu | H10D 30/6745 |
| | | | 257/66 |
| 2016/0071891 A1* | 3/2016 | Oh | H10D 86/441 |
| | | | 438/151 |
| 2016/0093647 A1* | 3/2016 | Kim | H10D 30/6723 |
| | | | 257/40 |
| 2019/0081074 A1* | 3/2019 | Zhang | H10D 86/60 |
| 2021/0098582 A1* | 4/2021 | Yan | H01L 23/485 |
| 2023/0110764 A1* | 4/2023 | Jeong | H10D 86/423 |
| | | | 257/288 |

FOREIGN PATENT DOCUMENTS

| | | | | |
|---|---|---|---|---|
| CN | 107946315 A | | 4/2018 | |
| CN | 108010919 A | | 5/2018 | |
| CN | 108598089 A | * | 9/2018 | ........... H10D 86/441 |
| CN | 109742031 A | * | 5/2019 | ......... H10D 30/6755 |
| CN | 113629151 A | | 11/2021 | |
| CN | 114220865 A | | 3/2022 | |
| KR | 19990054306 A | | 7/1999 | |

OTHER PUBLICATIONS

Written Opinion of the International Search Authority in International application No. PCT/CN2022/087932, mailed on Nov. 25, 2022.

Chinese Office Action issued in corresponding Chinese Patent Application No. 202210350183.4 dated Aug. 31, 2024, pp. 1-6.

\* cited by examiner

DISPLAY PANEL AND DISPLAY DEVICE

TECHNICAL FIELD

The present application relates to a technical field of display, and in particular, to a display panel and a display device.

BACKGROUND

Oxide thin film transistor (TFT) is considered to be one of the next generation thin film transistors with the greatest development potential because of its low process temperature, high mobility, transparency to visible light, capability of preparing large-area high-quality thin films at room temperature, compatibility with existing line production equipment and fabrication on flexible substrates.

Generally, a thin film transistor comprises a gate, an active layer, a source, and a drain, wherein the source and the drain are separately disposed at both ends of the active layer and are respectively in contact with the active layer. In practical application, a top gate structure has a smaller parasitic capacitance than a bottom gate structure, so it is more suitable for large-size applications. In existing top gate structures, before a source/drain is fabricated, a conducting process usually needs to be performed on a contact region of source and a contact region of drain of the active layer to improve connection characteristics of the active layer to the contact regions of source and drain. However, conductive carriers in the lap regions of the active layer may diffuse into a channel region of the active layer, resulting in a short channel effect, which will affect stability of the thin film transistor to some extent.

Technical Problem

Embodiments of the present application provide a mobile terminal for alleviating deficiencies in related technologies.

Technical Solution

Embodiments of the present application provide a display device for alleviating deficiencies in related technologies.

To realize the above functions, technical solutions provided in embodiments of the present application are as follows:

An embodiment of the present application provides a display panel comprising:
 a substrate; and
 a thin film transistor layer disposed on the substrate, wherein the thin film transistor layer comprises an active layer and a metal layer that are stacked, and the active layer comprises an active segment and a conductor segment connected to the active segment;
 wherein the conductor segment comprises a lap portion connected to the metal layer and a conductor sub-segment between the lap portion and the active segment, and a groove is formed in the conductor sub-segment.

In the display panel provided in an embodiment of the present application, the metal layer comprises a source and a drain disposed at intervals;
 the lap portion comprises a first lap portion in contact with the source and a second lap portion in contact with the drain, and the active segment is located between the first lap portion and the second lap portion; and
 the conductor sub-segment comprises a first conductor sub-segment between the first lap portion and the active segment, and a second conductor sub-segment between the second lap portion and the active segment;
 wherein the first conductor sub-segment is formed with a first groove, and the second conductor sub-segment is formed with a second groove.

In the display panel provided in an embodiment of the present application, the thin film transistor layer further comprises an insulating layer between the active layer and the metal layer, the insulating layer is formed with a first via hole corresponding to the first lap portion and the first conductor sub-segment and a second via hole corresponding to the second lap portion and the second conductor sub-segment, the source is connected to the first lap portion through the first via hole, and the drain is connected to the second lap portion through the second via hole; and
 wherein an orthographic projection of the first groove on the substrate is within an orthographic projection of the first via hole on the substrate, and an orthographic projection of the second groove on the substrate is within an orthographic projection of the second via hole on the substrate.

In the display panel provided in an embodiment of the present application, a side wall of the source close to one side of the first groove is coplanar with a side wall of one side of the first groove away from the active segment; and/or
 a side wall of the drain close to one side of the second groove is coplanar with a side wall of one side of the second groove away from the active segment.

In the display panel provided in an embodiment of the present application, an angle between the side wall of the source close to one side of the first groove and the substrate is equal to an angle between the side wall of one side of the first groove away from the active segment and the substrate.

In the display panel provided in an embodiment of the present application, a side wall of the first via hole close to one side of the active segment is coplanar with a side wall of the first groove close to one side of the active segment; and/or
 a side wall of the second via hole close to one side of the active segment is coplanar with a side wall of the second groove close to one side of the active segment.

In the display panel provided in an embodiment of the present application, the metal layer further comprises a gate located on one side of the insulating layer away from the active layer, the gate is located between the source and the drain, and the gate is disposed corresponding to the active segment.

In the display panel provided in an embodiment of the present application, a cross-sectional shape of the groove is selected from one of a circle, a rectangle or a polygon in a direction perpendicular to the substrate.

In the display panel provided in an embodiment of the present application, a depth of the groove is less than or equal to a thickness of the active layer.

In the display panel provided in an embodiment of the present application, a depth of the groove is equal to a thickness of the active layer; and
 the conductor sub-segment comprises a first side edge adjacent to the lap portion, a second side edge adjacent to the active segment, a third side edge adjacent to the first side edge or the second side edge, and a fourth side edge adjacent to the first side edge or the second side edge;

wherein a distance from any point in the groove to the third side edge is greater than 1 micron, and a distance from any point in the groove to the fourth side edge is greater than 1 micron.

An embodiment of the present application provides a display device, wherein the display device comprises a display panel, and the display panel comprises:

a substrate; and a thin film transistor layer disposed on the substrate, wherein the thin film transistor layer comprises an active layer and a metal layer that are stacked, and the active layer comprises an active segment and a conductor segment connected to the active segment;

wherein the conductor segment comprises a lap portion connected to the metal layer and a conductor sub-segment between the lap portion and the active segment, and a groove is formed in the conductor sub-segment.

In the display device provided in an embodiment of the present application, the metal layer comprises a source and a drain disposed at intervals;

the lap portion comprises a first lap portion in contact with the source and a second lap portion in contact with the drain, and the active segment is located between the first lap portion and the second lap portion; and the conductor sub-segment comprises a first conductor sub-segment between the first lap portion and the active segment, and a second conductor sub-segment between the second lap portion and the active segment;

wherein the first conductor sub-segment is formed with a first groove, and the second conductor sub-segment is formed with a second groove.

In the display device provided in an embodiment of the present application, the thin film transistor layer further comprises an insulating layer between the active layer and the metal layer, the insulating layer is formed with a first via hole corresponding to the first lap portion and the first conductor sub-segment and a second via hole corresponding to the second lap portion and the second conductor sub-segment, the source is connected to the first lap portion through the first via hole, and the drain is connected to the second lap portion through the second via hole; and wherein an orthographic projection of the first groove on the substrate is within an orthographic projection of the first via hole on the substrate, and an orthographic projection of the second groove on the substrate is within an orthographic projection of the second via hole on the substrate.

In the display device provided in an embodiment of the present application, a side wall of the source close to one side of the first groove is coplanar with a side wall of one side of the first groove away from the active segment; and/or a side wall of the drain close to one side of the second groove is coplanar with a side wall of one side of the second groove away from the active segment.

In the display device provided in an embodiment of the present application, an angle between the side wall of the source close to one side of the first groove and the substrate is equal to an angle between the side wall of one side of the first groove away from the active segment and the substrate.

In the display device provided in an embodiment of the present application, a side wall of the first via hole close to one side of the active segment is coplanar with a side wall of the first groove close to one side of the active segment; and/or a side wall of the second via hole close to one side of the active segment is coplanar with a side wall of the second groove close to one side of the active segment.

In the display device provided in an embodiment of the present application, the metal layer further comprises a gate located on one side of the insulating layer away from the active layer, the gate is located between the source and the drain, and the gate is disposed corresponding to the active segment.

In the display device provided in an embodiment of the present application, a cross-sectional shape of the groove in a direction perpendicular to the substrate is selected from one of a circle, a rectangle or a polygon.

In the display device provided in an embodiment of the present application, a depth of the groove is less than or equal to a thickness of the active layer.

In the display device provided in an embodiment of the present application, a depth of the groove is equal to a thickness of the active layer; and the conductor sub-segment comprises a first side edge adjacent to the lap portion, a second side edge adjacent to the active segment, a third side edge adjacent to the first side edge or the second side edge, and a fourth side edge adjacent to the first side edge or the second side edge;

wherein a distance from any point in the groove to the third side edge is greater than 1 micron, and a distance from any point in the groove to the fourth side edge is greater than 1 micron.

Technical Effects

Embodiments of the present application provide a display panel and a display device. By disposing a lap portion connected to a metal layer and a conductor sub-segment between the lap portion and an active segment on a conductor segment of a thin film transistor layer, and forming a groove in the conductor sub-segment, an overall surface of the conductor sub-segment can be reduced, thereby reducing diffusion of carriers to the active segment, and improving stability of the thin film transistor layer.

BRIEF DESCRIPTION OF THE DRAWINGS

The technical solutions and other beneficial effects of the present application will be apparent from detailed description of specific embodiments of the present application with reference to the accompanying drawings.

DETAILED DESCRIPTION

Embodiments of the present application provide a display panel and a display device. In order to make the purposes, technical solutions and effects of the present application more clear and definite, the present application is further described in detail with reference to the accompanying drawings and embodiments. It should be understood that the specific embodiments described herein are intended to explain the present application only and are not intended to limit the present application.

Embodiments of the present application provide a display panel and a display device. Details are described below. It should be noted that description order of the following embodiments is not taken as a limitation on the preferred order of the embodiments.

With reference to FIGS. 2-7D, embodiments of the present application provide a display panel and a display device, and the display panel 1 comprises:
 a substrate 10; and
 a thin film transistor layer 20 disposed on the substrate 10, wherein the thin film transistor layer 20 comprises an active layer 21 and a metal layer 23 that are stacked, and the active layer 21 comprises an active segment 211 and a conductor segment 212 connected to the active segment 211;
 wherein the conductor segment 212 comprises a lap portion 212A connected to the metal layer 23 and a conductor sub-segment 212B between the lap portion 212A and the active segment 211, and a groove 212C is formed in the conductor sub-segment 212B.

Figure 1:
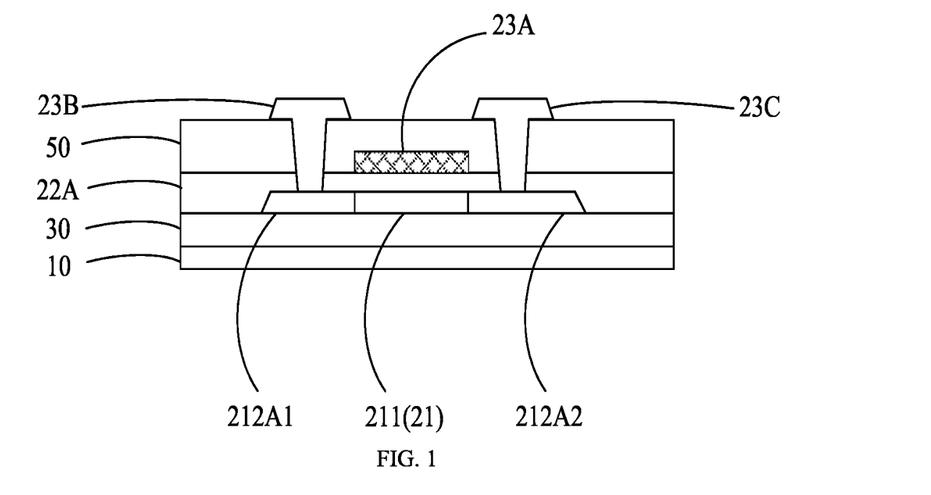
FIG. 1 is a schematic cross-sectional view of an existing display panel.

It can be understood that, at present, in a prior art display panel, as shown in FIG. 1, which is a schematic cross-sectional view of an existing display panel 1. The display panel comprises a substrate 10, and a buffer layer 30, an active layer 21, a gate insulating layer 22A, a gate 23A, a passivation layer 50, a source 23B, and a drain 23 C that are stacked on the substrate 10. The active layer 21 comprises an active segment 211 corresponding to the gate 23A, a first lap portion 212A1 in contact with the source 23B, and a second lap portion 212A2 in contact with the drain 23C. In the structure of the existing display panel, before the source 23B and the drain 23C are fabricated, a conducting process usually needs to be performed on the first lap portion 212A1 and the second lap portion 212A2 of active layer 21 to improve connection characteristics of the active layer 21 to the contact regions of the source 23B and the drain 23C. However, conductive carriers located at the lap portion 212A of the active layer 21 may diffuse into the active segment 211 of the active layer 21, resulting in a short channel effect, which will affect stability of the thin film transistor layer 20.

Figure 2:
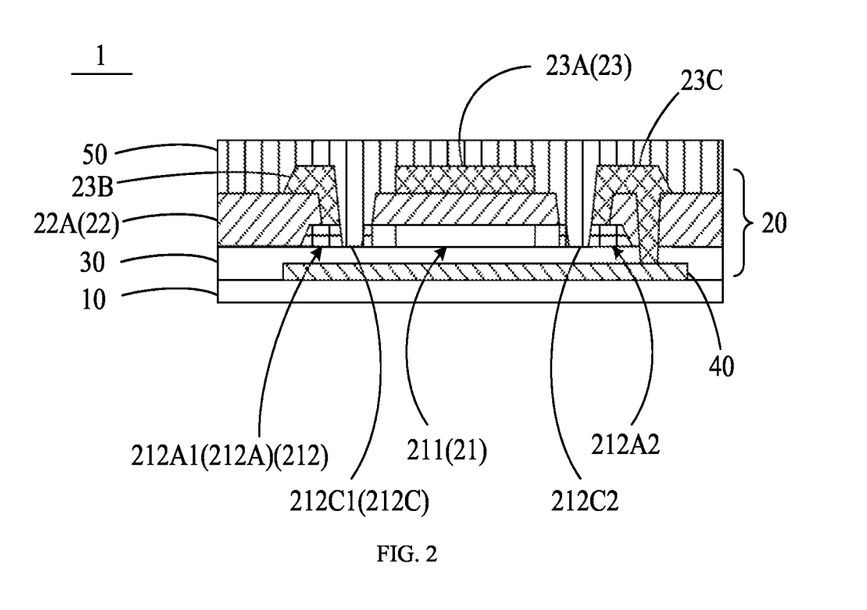
FIG. 2 is a first schematic cross-sectional view of a display panel according to an embodiment of the present application.
Figure 3:
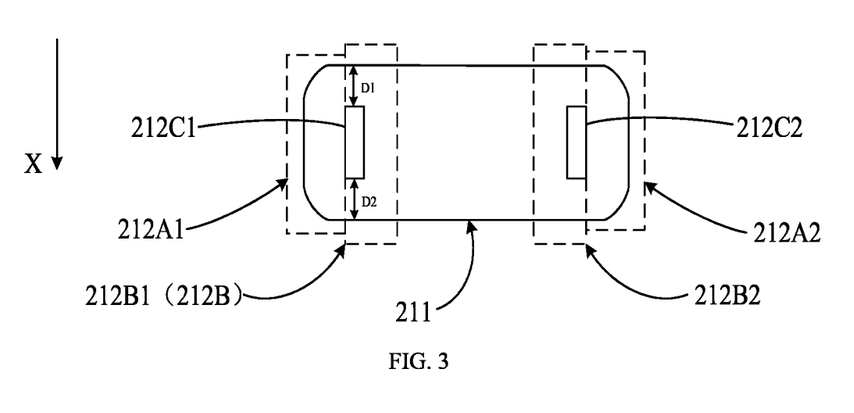
FIG. 3 is a first top view of an active layer according to an embodiment of the present application.

In contrast to the above, in embodiments of the present disclosure, the conductor segment 212 in the thin film transistor layer 20 is disposed with a lap portion 212A connected to the metal layer 23, a conductor sub-segment 212B located between the lap portion 212A and the active segment 211, and a groove 212C is formed in the conductor sub-segment 212B. The groove 212C is used to prevent carriers in the lap portion 212A from diffusing toward the active segment 211 after the active layer 21 is subject to the conducting process, thus improving stability of the thin film transistor layer 20.

In an embodiment, with reference to FIG. 2 and FIG. 3. FIG. 2 is a first schematic cross-sectional view of a display panel according to an embodiment of the present application. FIG. 3 is a first top view of an active layer according to an embodiment of the present application.

This embodiment provides a display panel 1, which comprises, but is not limited to, any one of a light-emitting diode (LED) and an organic light-emitting diode (OLED) 1, which is not specifically limited in this embodiment.

In this embodiment, the display panel 1 comprises a substrate 10, a buffer layer 30, and a thin film transistor layer 20 on one side of the buffer layer 30 away from the substrate 10. The thin film transistor layer 20 comprises an active layer 21 and a metal layer 23 that are stacked.

The substrate 10 comprises a first substrate (not shown in the figures), a spacer layer (not shown in the figures), and a second substrate (not shown in the figures) that are sequentially stacked. The first substrate and the second substrate may each comprise a rigid substrate or a flexible substrate, and when both the first substrate and the second substrate are rigid substrates, a material thereof may be a metal or glass, and when both the first substrate and the second substrate are flexible substrates, a material thereof may comprise at least one of an acrylic resin, a methacrylic resin, polyisoprene, a vinyl resin, an epoxy resin, a polyurethane resin, a cellulose resin, a silicone resin, a polyimide resin, and a polyamide resin. A material of the spacer layer comprises, but is not limited to, a material with water absorption properties such as silicon nitride ($SiN_x$), silicon oxide ($SiO_x$), etc., and materials of the first substrate, the second substrate, and the spacer layer are not limited to the above in this embodiment.

The active layer 21 comprises, but is not limited to, an oxide active layer 21, and a material thereof comprises but is not limited to indium gallium zinc oxide (IGZO). A material of the metal layer 23 comprises at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta) and tungsten (W).

The active layer 21 comprises an active segment 211 and a conductor segment 212 connected to the active segment 211. The conductor segment 212 comprises a lap portion 212A connected to the metal layer 23 and a conductor sub-segment 212B between the lap portion 212A and the active segment 211, and a groove 212C is formed in the conductor sub-segment 212B. Specifically, in the structure of a prior art display panel 1, a conducting process usually needs to be performed on the lap portion of the active layer 21 to improve connection characteristics of the active layer 21 to a contact region of the metal layer 23. After the active layer 21 is subject to the conducting process, carriers in the lap portion 212A tend to diffuse toward the active segment 211. The groove 212 C is used to prevent carriers in the lap portion 212A from diffusing toward the active segment 211 after the active layer 21 is subject to the conducting process, thus improving stability of the thin film transistor layer 20.

Furthermore, a cross-sectional shape of the groove 212C is selected from one of a circle, a rectangle or a polygon in a direction perpendicular to the substrate 10. A depth of the groove 212C is less than or equal to a thickness of the active layer 21, that is, the groove 212C may be one of a groove structure or a via hole structure. Specifically, in this embodiment, an example in which the cross-sectional shape of the groove 212C is a rectangle, and the depth of the groove 212C is equal to the thickness of the active layer 21 is taken to illustrate technical solutions of the present application. In a specific embodiment, the depth of the groove 212 C may be set according to specific needs or experience.

Preferably, the conductor sub-segment 212B comprises a first side edge (not shown in the figures) adjacent to the lap portion 212A, a second side edge (not shown in the figures) adjacent to the active segment 211, a third side edge (not shown in the figures) adjacent to the first side edge or the second side edge, and a fourth side edge (not shown in the figures) adjacent to the first side edge or the second side edge. A distance D1 from any point in the groove 212C to the third side edge is greater than 1 micron, and a distance D2 from any point in the groove 212C to the fourth side edge is greater than 1 micron. It can be understood that, before the metal layer 23 is fabricated, a conducting process usually needs to be performed on the lap portion 212A of the active layer 21 to improve connection characteristics of the active layer 21 to contact regions of the metal layer 23. In this embodiment, by setting the distance from any point in the groove 212C to the third side edge to be greater than 1 micron, and the distance from any point in the groove 212 C to the fourth side edge to be greater than 1 micron, conductive path of the carriers can be maintained, so that the thin film transistor layer 20 is kept stable in a working state.

It should be noted that the number of the groove 212C is not specifically limited in this embodiment. In this embodiment, the groove 212C are disposed in the conductor segment 212 to reduce an overall surface of the conductor sub-segment 212B, thereby reducing diffusion of carriers into the active segment 211 and improving stability of the thin film transistor layer 20.

Furthermore, in this embodiment, the metal layer 23 comprises a source 23B and a drain 23C disposed at intervals, and the source 23B and the drain 23C are connected to the lap portion 212A of the active layer 21. Specifically, the lap portion 212A comprises a first lap portion 212A1 in contact with the source 23B and a second lap portion 212A2 in contact with the drain 23C, and the active segment 211 is located between the first lap portion 212A1 and the second lap portion 212A2. The conductor sub-segment 212B comprises a first conductor sub-segment 212B1 between the first lap portion 212A1 and the active segment 211, and a second conductor sub-segment 212B2 between the second lap portion 212A2 and the active segment 211. The first conductor sub-segment 212B1 is formed with a first groove 212C1, and the second conductor sub-segment 212B2 is formed with a second groove 212C2.

It can be understood that in this embodiment, the conductor sub-segment 212B comprises a first conductor sub-segment 212B1 between the first lap portion 212A1 and the active segment 211, and a second conductor sub-segment 212B2 between the second lap portion 212A2 and the active segment 211. The first conductor sub-segment 212B1 is formed with a first groove 212C1, so as to reduce an overall surface of the first conductor sub-segment 212B1. Meanwhile, the second conductor sub-segment 212B2 is formed with a second groove 212C2, so as to reduce an overall surface of the second conductor sub-segment 212B2, thereby reducing diffusion of carriers to the active segment 211 and improving stability of the thin film transistor layer 20.

Preferably, in the present embodiment, the active segment 211 further comprises a first transition segment close to the first conductor sub-segment 212B1 and a second transition segment close to the second conductor sub-segment 212B2. Along a first direction X, a length of an orthographic projection of the first transition segment on the substrate 10 is shorter than a length of an orthographic projection of the first conductor sub-segment 212B1 on the substrate 10, and a length of an orthographic projection of the second transition segment on the substrate 10 is shorter than a length of an orthographic projection of the second conductor sub-segment 212B2 on the substrate 10. It should be noted that the first direction is the direction X in FIG. 3.

It can be understood that, in this embodiment, by disposing the first transition segment and the second transition segment on the active layer 21, conductive path of carriers in the active layer 21 is reduced, so as to ensure that an effective length of the active segment 211 is not affected, while alleviating diffusion of carriers into the active segment 211 and improving stability of the thin film transistor layer 20. Meanwhile, by setting a length of an orthographic projection of the first transition segment on the substrate 10 shorter than a length of an orthographic projection on the first conductor sub-segment 212B1 on the substrate 10, and a length of an orthographic projection of the second transition segment on the substrate 10 shorter than a length of an orthographic projection of the second conductor sub-segment 212B2 on the substrate 10, conductive path of carriers in the conductor segment 212 can be maintained, and the thin film transistor layer 20 is kept stable in a working state.

Furthermore, in this embodiment, the thin film transistor layer 20 further comprises an insulating layer 22 between the active layer 21 and the metal layer 23, and an orthographic projection of the insulating layer 22 on the substrate 10 covers the first transition segment and the second transition segment, that is, the first transition segment and the second transition segment are non-conductive portions of the active layer 21.

A first via hole corresponding to the first lap portion 212A1 and the first conductor sub-segment 212B1, and a second via hole corresponding to the second lap portion 212A2 and the second conductor sub-segment 212B2 are formed on the insulating layer 22. The source 23B is connected to the first lap portion 212A1 through the first via hole, and the drain 23C is connected to the second lap portion 212A2 through the second via hole. An orthographic projection of the first groove 212C1 on the substrate 10 is within an orthographic projection of the first via hole on the substrate 10, and an orthographic projection of the second groove 212C2 on the substrate 10 is within an orthographic projection of the second via hole on the substrate 10. Specifically, a width of the orthographic projection of the first groove 212C1 on the substrate 10 is less than a width of the orthographic projection of the first via hole on the substrate 10, so as to control size of the first groove 212C1. A width of the orthographic projection of the second groove 212C2 on the substrate 10 is less than a width of the orthographic projection of the second via hole on the substrate 10, so as to control size of the second groove 212C2, so that conductive path of carriers in the conductor segment 212 can be maintained, and the thin film transistor layer 20 is kept stable in a working state.

Furthermore, a side wall of the source 23B close to one side of the first groove 212C1 is coplanar with a side wall of one side of the first groove 212C1 away from the active segment 211. Specifically, an angle between the side wall of the source 23B close to one side of the first groove 212C1 and the substrate 10 is equal to an angle between the side wall of one side of the first groove 212C1 away from the active segment 211 and the substrate 10. A side wall of the drain 23C close to one side of the second groove 212C2 is coplanar with a side wall of one side of the second groove 212C2 away from the active segment 211. Specifically, an angle between the side wall of the drain 23C close to one side of the second groove 212C2 and the substrate 10 is equal to an angle between the side wall of one side of the second groove 212C2 away from the active segment 211 and the substrate 10.

It can be understood that, in this embodiment, by setting a side wall of the source 23B close to one side of the first groove 212C1 being coplanar with a side wall of one side of the first groove 212C1 away from the active segment 211, and a side wall of the drain 23C close to one side of the second groove 212C2 being coplanar with a side wall of one side of the second groove 212C2 away from the active segment 211, the first groove 212C1, the source 23B, the second groove 212C2, and the drain 23C can be fabricated in the same process, thus minimizing process flow of the display panel 1 and saving fabrication cost.

Furthermore, the metal layer 23 further comprises a gate 23A located on one side of the insulating layer 22 away from the active layer 21, the gate 23A is located between the source 23B and the drain 23C, and the gate 23A is disposed corresponding to the active segment 211, that is, the active layer 21, the insulating layer 22 and the gate 23A are sequentially stacked. In this embodiment, technical solutions of the present application are illustrated by taking the insulating layer 22 as a gate insulating layer 22A as an example. It can be understood that, in this embodiment, the source 23B, the drain 23C, and the gate 23 A are located in the same film layer, and can be fabricated in the same process, thereby maximizing the reduction of the process flow of the display panel 1 and saving fabrication cost.

It should be noted that in this embodiment, the active layer 21, the insulating layer 22, and the gate 23A are stacked, and the source 23B, the drain 23C, and the gate 23A are located in the same film layer, which are used for illustration only. In this embodiment, positions of the source 23B, the drain 23C, and the gate 23A are not specifically limited the present disclosure.

Figure 4:
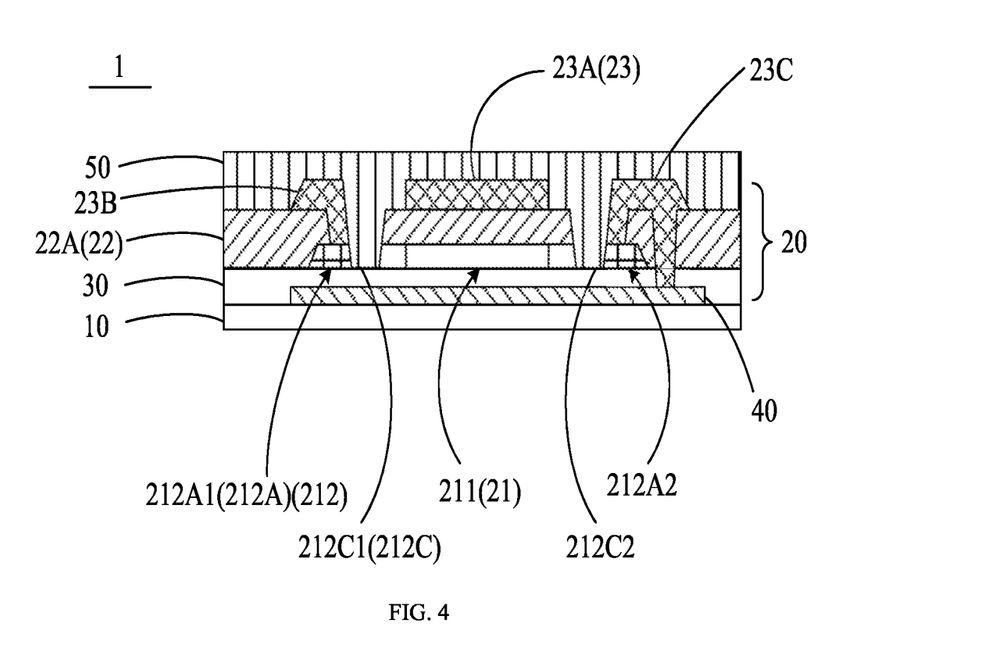
FIG. 4 is a second schematic cross-sectional view of a display panel according to an embodiment of the present application.
Figure 5:
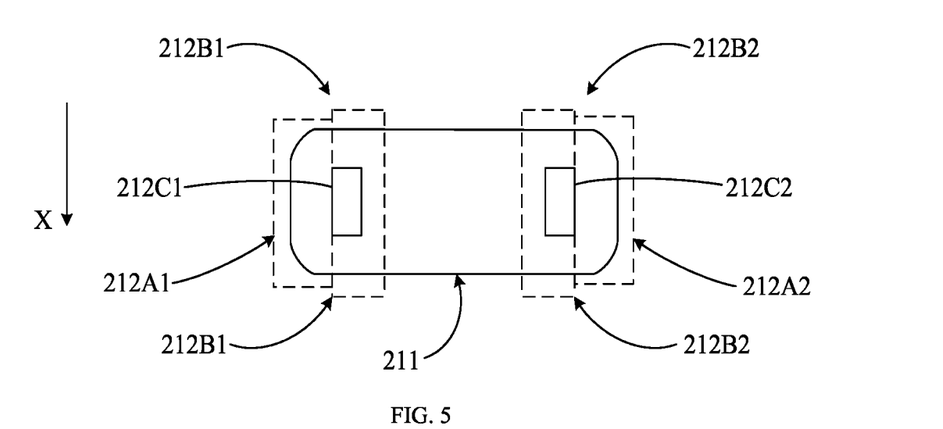
FIG. 5 is a second top view of an active layer according to an embodiment of the present application.
Figure 6:
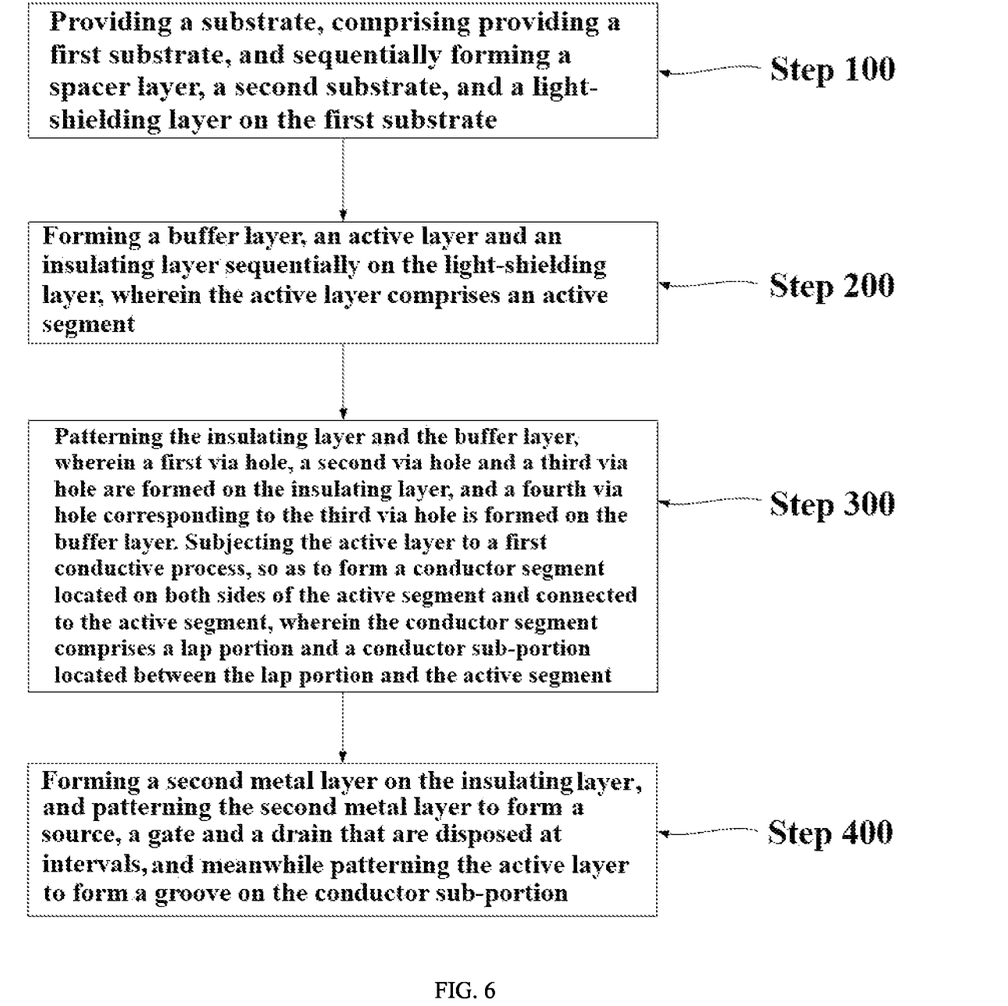
FIG. 6 is flowchart of a method for manufacturing a display panel according to an embodiment of the present application.

In another embodiment, with reference to FIGS. 4 and 5. FIG. 4 is a second schematic cross-sectional view of a display panel according to an embodiment of the present application. FIG. 5 is a second top view of an active layer according to an embodiment of the present application.

In this embodiment, structure of the display panel 1 is similar to/the same as that of the display panel 1 provided in the foregoing embodiment. For details, please refer to description of the display panel 1 in the foregoing embodiment. Details are not repeated herein. The differences between the two lie only in that:

A side wall of the first via hole close to one side of the active segment 211 is coplanar with a side wall of one side of the first groove 212C1 close to the active segment 211. Specifically, an angle between the side wall of the first via hole close to the active segment 211 and the substrate 10 is equal to an angle between the side wall of the first groove 212C1 close to the active segment 211 and the substrate 10. A side wall of the second via hole close to one side of the active segment 211 is coplanar with a side wall of one side of the second groove 212C2 close to the active segment 211. Specifically, an angle between the side wall of the second via hole close to one side of the active segment 211 and the substrate 10 is equal to an angle between the side wall of the second groove 212C2 close to one side of the active segment 211 and the substrate 10.

It can be understood that, in this embodiment, by setting a side wall of the first via hole close to one side of the active segment 211 being coplanar with a side wall of one side of the first groove 212C1 close to the active segment 211, an overall surface of the first conductor sub-segment 212B1 can be reduced to the greatest extent. Meanwhile, by setting a side wall of the second via hole close to one side of the active segment 211 being coplanar with a side wall of one side of the second groove 212C2 close to the active segment 211, an overall surface of the second conductor sub-segment 212B2 can be reduced to the greatest extent. Compared with the above embodiments, in this embodiment, diffusion of carriers into the active segment 211 is further weakened, thus improving stability of the thin film transistor layer 20.

It should be noted that, in this embodiment, the display panel 1 further comprises a light-shielding layer 40 between the buffer layer 30 and the substrate 10. An orthographic projection of the active layer 21 on the substrate 10 is located in an orthographic projection of the light-shielding layer 40 on the substrate 10. A third via hole corresponding to the light-shielding layer 40 is further formed in the insulating layer 22, a fourth via hole corresponding to the light-shielding layer 40 is formed in the buffer layer, and the drain 23C is connected to the light-shielding layer 40 through the third via hole and the fourth via hole. It can be understood that the light-shielding layer 40 can shield lights incident on the active layer 21, thereby reducing increase in leakage current caused by the photo-generated carriers generated by lights irradiating the active layer 21, thereby maintaining stability of the display panel 1 in working.

Figure 7A:
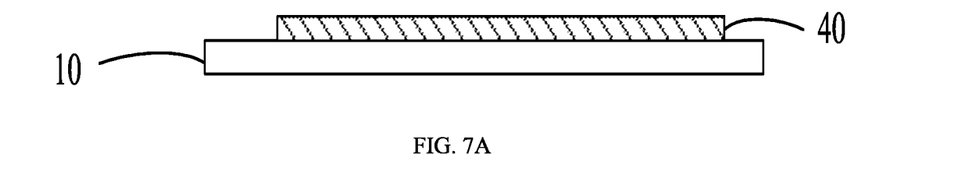
FIGS. 7A-7D are structural process flowcharts for manufacturing the display panel in FIG. 6.

An embodiment of the present application further provides a method for manufacturing a display panel. With reference to FIGS. 2, 3, 6, and 7A-7D, the method for manufacturing a display panel comprises steps as follows:

Step 100: providing a substrate 10, comprising providing a first substrate, and sequentially forming a spacer layer, a second substrate, and a light-shielding layer 40 on the first substrate; as shown in FIG. 7A.

Wherein, a material of the light-shielding layer 40 comprises, but is not limited to, a metal or a light-tight nonmetal. In this embodiment, it is preferable that a material of the light-shielding layer 40 is a metal material, and the light-shielding layer 40 comprises a first metal sublayer, a second metal sublayer and a third metal sublayer that are stacked. Materials of the first metal sublayer and the third metal sublayer both comprise, but are not limited to, one or alloys of molybdenum, titanium and nickel, and thicknesses of the first metal sublayer and the third metal sublayer are both ranging from 50 Am (Å) to 500 Am (Å). A material of the second metal sublayer comprises, but is not limited to, copper or a copper alloy, and a thickness of the second metal sublayer is ranging from 2000 Am (Å) to 10,000 Am (Å). Specifically, in this embodiment, by depositing the first metal layer on the substrate 10, and using a first yellow light process to pattern the first metal layer by wet etching (Wet), a pattern of the light-shielding layer 40 having a wiring and a light-shielding effect can be formed.

Figure 7B:
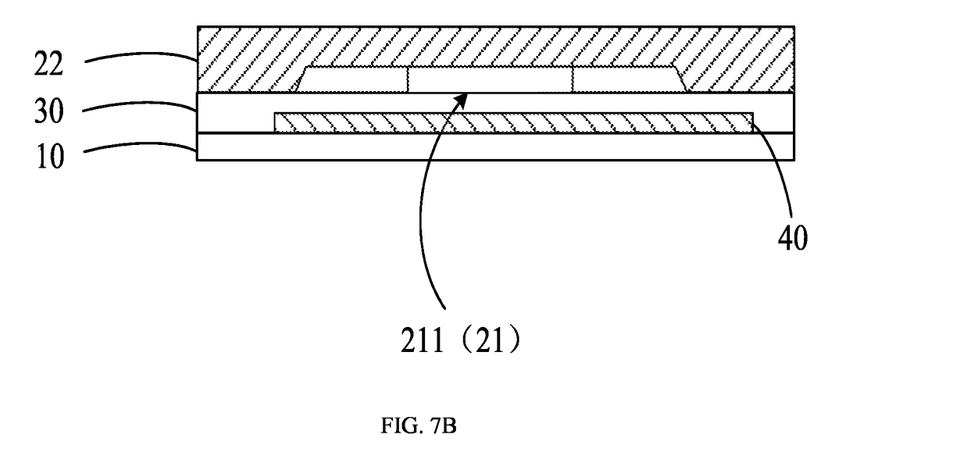

Step 200: forming a buffer layer 30, an active layer 21 and an insulating layer 22 sequentially on the light-shielding layer 40, wherein the active layer 21 comprises an active segment 211; as shown in FIG. 7B.

Wherein, the buffer layer comprises, but is not limited to, a single layer of silicon nitride ($Si_3N_4$), a single layer of silicon dioxide ($SiO_2$), a single layer of silicon oxynitride ($SiON_x$), or a double-layer structure of the above film layers. A method for manufacturing the buffer layer comprises, but is not limited to, a plasma-enhanced chemical vapor deposition (PECVD) method. A thickness of the buffer layer 30 is ranging from 1000 Am (Å) to 6000 Am (Å).

The active layer 21 comprises, but is not limited to, an oxide semiconductor layer, and a material of the oxide semiconductor layer comprises, but is not limited to, indium gallium zinc oxide (IGZO), indium tin zinc oxide (ITZO), or indium gallium zinc titanium oxide (IGZTO). Specifically, an oxide semiconductor layer is deposited on the buffer layer 30 by using a physical vapor deposition method (PVD), and the oxide semiconductor layer is patterned by using a second yellow light process, thereby forming the active layer 21. A thickness of the active layer 21 is ranging from 100 Am (Å) to 1,000 Am (Å).

A material of the insulating layer 22 comprises, but is not limited to, silicon oxide ($SiO_x$). A method for manufacturing the insulating layer comprises, but is not limited to, a plasma enhanced chemical vapor deposition (PECVD) method, wherein oxygen contents can be controlled by a PECVD process. A thickness of the insulating layer 22 is ranging from 300 Am (Å) to 3000 Am (Å).

Figure 7C:
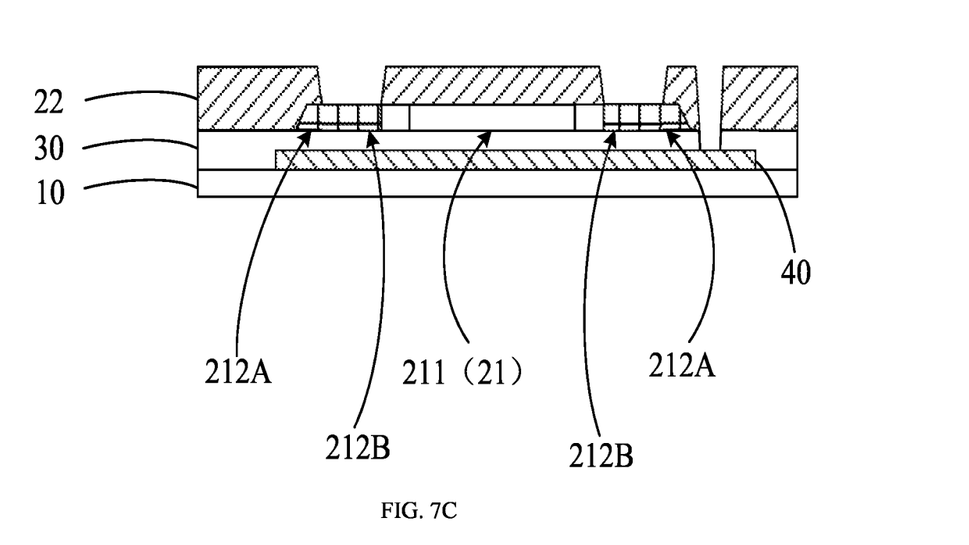

Step 300: Patterning the insulating layer 22 and the buffer layer 30, wherein a first via hole, a second via hole and a third via hole are formed on the insulating layer 22, and a fourth via hole corresponding to the third via hole is formed on the buffer layer 30. Meanwhile, subjecting the active layer 21 to a first conducting process, so as to form a conductor segment 212 located on both sides of the active segment 211 and connected to the active segment 211, wherein the conductor segment 212 comprises a lap portion 212A and a conductor sub-segment 212B located between the lap portion 212A and the active segment 211; as shown in FIG. 7C.

A method for patterning the insulating layer 22 comprises, but is not limited to, a third yellow light process. An angle between a side wall of the fourth via hole and the substrate 10 is equal to an angle between a side wall of the third via hole and the substrate 10.

Figure 7D:
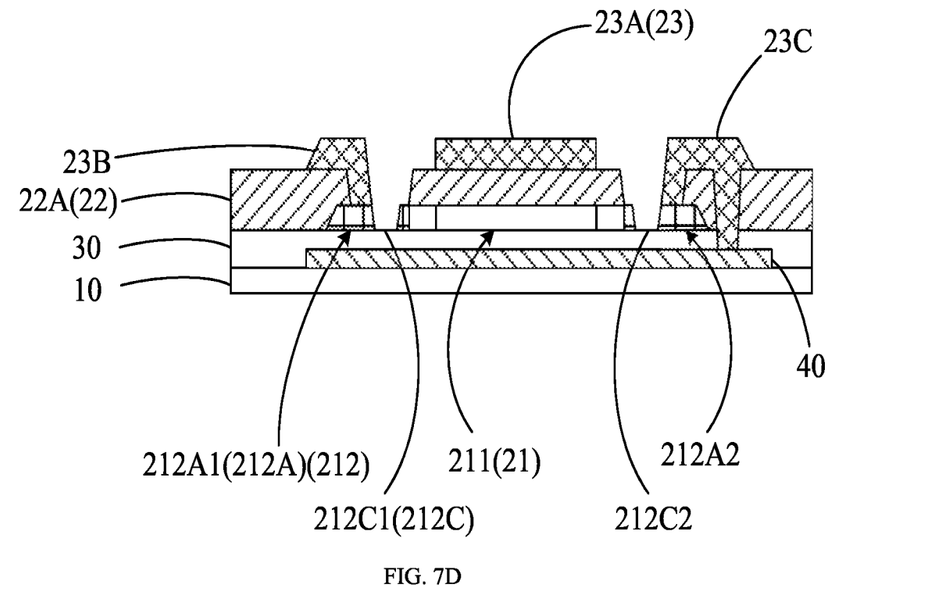

Step 400: Forming a second metal layer on the insulating layer 22, and patterning the second metal layer to form a source 23B, a gate 23A and a drain 23C that are disposed at intervals, and meanwhile patterning the active layer 21 to form a groove 212C on the conductor sub-segment 212B; as shown in FIG. 7D.

Wherein, a method of forming the second metal layer on the insulating layer 22 comprises a physical vapor deposition (PVD) method. Specifically, the second metal layer comprises a fourth metal sublayer and a fifth metal sublayer that are attacked. A material of the fourth metal sublayer comprises, but is not limited to, one or alloys of molybdenum (Mo), titanium (Ti), and nickel (Ni), and a thickness of the fourth metal sublayer is ranging from 50 Am (Å) to 500 Am (Å). A material of the fifth metal sublayer comprises, but is not limited to, copper or a copper alloy, and a thickness of the fifth metal sublayer is ranging from 2,000 Am (Å) to 10000 Am (Å).

In step 400, the second metal layer is patterned by a fourth yellow light process, and the two layers of metal traces are etched by a wet etching process to form a source 23B, a gate 23A, and a drain 23C that are disposed at intervals, wherein the gate 23A is disposed corresponding to the active segment 211. It can be understood that, in this embodiment, the source 23B, the drain 23C, and the gate 23A are located in the same film layer, and can be fabricated in the same process, thereby maximizing the reduction of the process flow of the display panel 1 and saving fabrication cost.

Specifically, the lap portion 212A comprises a first lap portion 212A1 in contact with the source 23B and a second lap portion 212A2 in contact with the drain 23C, and the active segment 211 is located between the first lap portion 212A1 and the second lap portion 212A2. The conductor sub-segment 212B comprises a first conductor sub-segment 212B1 between the first lap portion 212A1 and the active segment 211, and a second conductor sub-segment 212B2 between the second lap portion 212A2 and the active segment 211. The first conductor sub-segment 212B1 is formed with a first groove 212C1, and the second conductor sub-segment 212B2 is formed with a second groove 212C2.

Furthermore, the first via hole corresponds to the first lap portion 212A1 and the first conductor sub-segment 212B1, the second via hole corresponds to the second lap portion 212A2 and the second conductor sub-segment 212B2, the source 23B is connected to the first lap portion 212A1 through the first via hole, and the drain 23C is connected to the second lap portion 212A2 through the second via hole, wherein an orthographic projection of the first groove 212C1 on the substrate 10 is within an orthographic projection of the first via hole on the substrate 10, and an orthographic projection of the second groove 212C2 on the substrate 10 is within an orthographic projection of the second via hole on the substrate 10.

Preferably, a side wall of the source 23B close to one side of the first groove 212C1 is coplanar with a side wall of one side of the first groove 212C1 away from the active segment 211. Specifically, an angle between the side wall of the source 23B close to one side of the first groove 212C1 and the substrate 10 is equal to an angle between the side wall of one side of the first groove 212C1 away from the active segment 211 and the substrate 10. A side wall of the drain 23C close to one side of the second groove 212C2 is coplanar with a side wall of one side of the second groove 212C2 away from the active segment 211. Specifically, an angle between the side wall of the drain 2C close to one side of the second groove 212C2 and the substrate 10 is equal to an angle between the side wall of one side of the second groove 212C2 away from the active segment 211 and the substrate 10.

It can be understood that, in this embodiment, by setting a side wall of the source 23B close to one side of the first groove 212C1 being coplanar with a side wall of one side of the first groove 212C1 away from the active segment 211, and a side wall of the drain 23C close to one side of the second groove 212C2 being coplanar with a side wall of one side of the second groove 212C2 away from the active segment 211, the first groove 212C1, the source 23B, the second groove 212C2, and the drain 23C can be fabricated in the same process, thus minimizing process flow of the display panel 1 and saving fabrication cost.

From the above, in this embodiment, the conductor sub-segment 212B comprises a first conductor sub-segment 212B1 between the first lap portion 212A1 and the active segment 211, and a second conductor sub-segment 212B2 between the second lap portion 212A2 and the active segment 211. The first conductor sub-segment 212B1 is formed with a first groove 212C1, so as to reduce an overall surface of the first conductor sub-segment 212B1. Meanwhile, the second conductor sub-segment 212B2 is formed with a second groove 212C2, so as to reduce an overall surface of the second conductor sub-segment 212B2, thereby reducing diffusion of carriers to the active segment 211 and improving stability of the thin film transistor layer 20.

In this embodiment, a method for manufacturing the display panel further comprises steps as follows:

Step 500: Etching the insulating layer 22, self-aligning to form the gate 23A/the gate insulating layer 22A/a channel region structure of the active layer, and subjecting the active layer 21 to a second conducting process.

Step 600: Forming a passivation layer 50 on the source 23B, the drain 23C and the gate 23A; as shown in FIG. 2.

Wherein, a material of the passivation layer 50 comprises, but is not limited to, silicon dioxide ($SiO_2$), and a thickness of the passivation layer is ranging from 1000 Am (Å) to 5,000 Am (Å).

This embodiment provides a display device comprising the display panel described in any one of the above embodiments.

It is understood that the display panel has been described in detail in the above embodiments, and descriptions will not be repeated hereinafter.

In specific applications, the display device may be a display screen of a device such as a smartphone, a tablet computer, a laptop, a smart bracelet, a smart watch, smart glasses, a smart helmet, a desktop computer, a smart TV or a digital camera, and may even be applied to an electronic device with a flexible display screen.

In view of the above, the present application provides a display panel and a display device. The display panel comprises a substrate and a thin film transistor layer disposed on the substrate, wherein the thin film transistor layer comprises an active layer and a metal layer that are stacked, and the active layer comprises an active segment and a conductor segment connected to the active segment. According to the present application, by disposing a lap portion connected to a metal layer and a conductor sub-segment between the lap portion and an active segment on a conductor segment, and forming a groove in the conductor sub-segment, an overall surface of the conductor sub-segment can be reduced, thereby reducing diffusion of carriers to the active segment, and improving stability of the thin film transistor layer.

In the above embodiments, descriptions of each embodiment has its own emphasis. For the parts not detailed in one embodiment, please refer to related description of other embodiments.

The display panel and the display device provided in embodiments of the present application are described in detail above. The principles and embodiments of the present application are described by using specific examples herein. Descriptions of the above embodiments are merely intended to help understand the method and core ideas of the present application. Meanwhile, for a person skilled in the art, according to ideas of the present application, there will be changes in the specific implementation and application scopes. In conclusion, contents of the specification shall not be construed as a limitation to the present application.

What is claimed is:

1. A display panel, comprising:
 a substrate; and
 a thin film transistor layer disposed on the substrate, wherein the thin film transistor layer comprises an active layer and a metal layer that are stacked, the active layer comprises an active segment and a conductor segment connected to the active segment, and the metal layer comprises a source and a drain disposed at intervals;
 wherein the conductor segment comprises a lap portion connected to the metal layer and a conductor sub-segment between the lap portion and the active segment, and a groove is formed in the conductor sub-segment, the lap portion comprises a first lap portion in contact with the source and a second lap portion in contact with the drain, and the active segment is located between the first lap portion and the second lap portion; the conductor sub-segment comprises a first conductor sub-segment between the first lap portion and the active segment, and a second conductor sub-segment between the second lap portion and the active segment, the first conductor sub-segment is formed with a first groove, and the second conductor sub-segment is formed with a second groove; and
 wherein a side wall of the source close to one side of the first groove is coplanar with a side wall of one side of the first groove away from the active segment; and/or
 a side wall of the drain close to one side of the second groove is coplanar with a side wall of one side of the second groove away from the active segment.

2. The display panel according to claim 1, wherein the thin film transistor layer further comprises an insulating layer between the active layer and the metal layer, the insulating layer is formed with a first via hole corresponding to the first lap portion and the first conductor sub-segment and a second via hole corresponding to the second lap portion and the second conductor sub-segment, the source is connected to the first lap portion through the first via hole, and the drain is connected to the second lap portion through the second via hole; and
 wherein an orthographic projection of the first groove on the substrate is within an orthographic projection of the first via hole on the substrate, and an orthographic projection of the second groove on the substrate is within an orthographic projection of the second via hole on the substrate.

3. The display panel according to claim 2, wherein a side wall of the first via hole close to one side of the active segment is coplanar with a side wall of the first groove close to one side of the active segment; and/or
 a side wall of the second via hole close to one side of the active segment is coplanar with a side wall of the second groove close to one side of the active segment.

4. The display panel according to claim 2, wherein the metal layer further comprises a gate located on one side of the insulating layer away from the active layer, the gate is located between the source and the drain, and the gate is disposed corresponding to the active segment.

5. The display panel according to claim 1, wherein an angle between the side wall of the source close to one side of the first groove and the substrate is equal to an angle between the side wall of one side of the first groove away from the active segment and the substrate.

6. The display panel according to claim 1, wherein a cross-sectional shape of the groove in a direction perpendicular to the substrate is selected from one of a circle, a rectangle or a polygon.

7. The display panel according to claim 1, wherein a depth of the groove is less than or equal to a thickness of the active layer.

8. The display panel according to claim 7, wherein a depth of the groove is equal to a thickness of the active layer; and
 the conductor sub-segment comprises a first side edge adjacent to the lap portion, a second side edge adjacent to the active segment, a third side edge adjacent to the first side edge or the second side edge, and a fourth side edge adjacent to the first side edge or the second side edge;
 wherein a distance from any point in the groove to the third side edge is greater than 1 micron, and a distance from any point in the groove to the fourth side edge is greater than 1 micron.

9. A display device, wherein the display device comprises a display panel, and the display panel comprises:
 a substrate; and
 a thin film transistor layer disposed on the substrate, wherein the thin film transistor layer comprises an active layer and a metal layer that are stacked, the active layer comprises an active segment and a conductor segment connected to the active segment, and the metal layer comprises a source and a drain disposed at intervals;

wherein the conductor segment comprises a lap portion connected to the metal layer and a conductor sub-segment between the lap portion and the active segment, and a groove is formed in the conductor sub-segment, the lap portion comprises a first lap portion in contact with the source and a second lap portion in contact with the drain, and the active segment is located between the first lap portion and the second lap portion; the conductor sub-segment comprises a first conductor sub-segment between the first lap portion and the active segment, and a second conductor sub-segment between the second lap portion and the active segment, the first conductor sub-segment is formed with a first groove, and the second conductor sub-segment is formed with a second groove; and wherein a side wall of the source close to one side of the first groove is coplanar with a side wall of one side of the first groove away from the active segment; and/or a side wall of the drain close to one side of the second groove is coplanar with a side wall of one side of the second groove away from the active segment.

10. The display device according to claim 9, wherein the thin film transistor layer further comprises an insulating layer between the active layer and the metal layer, the insulating layer is formed with a first via hole corresponding to the first lap portion and the first conductor sub-segment and a second via hole corresponding to the second lap portion and the second conductor sub-segment, the source is connected to the first lap portion through the first via hole, and the drain is connected to the second lap portion through the second via hole; and wherein an orthographic projection of the first groove on the substrate is within an orthographic projection of the first via hole on the substrate, and an orthographic projection of the second groove on the substrate is within an orthographic projection of the second via hole on the substrate.

11. The display device according to claim 10, wherein a side wall of the first via hole close to one side of the active segment is coplanar with a side wall of the first groove close to one side of the active segment; and/or a side wall of the second via hole close to one side of the active segment is coplanar with a side wall of the second groove close to one side of the active segment.

12. The display device according to claim 10, wherein the metal layer further comprises a gate located on one side of the insulating layer away from the active layer, the gate is located between the source and the drain, and the gate is disposed corresponding to the active segment.

13. The display device according to claim 9, wherein an angle between the side wall of the source close to one side of the first groove and the substrate is equal to an angle between the side wall of one side of the first groove away from the active segment and the substrate.

14. The display device according to claim 9, wherein a cross-sectional shape of the groove is selected from one of a circle, a rectangle or a polygon in a direction perpendicular to the substrate.

15. The display device according to claim 9, wherein a depth of the groove is less than or equal to a thickness of the active layer.

16. The display device according to claim 15, wherein a depth of the groove is equal to a thickness of the active layer; and the conductor sub-segment comprises a first side edge adjacent to the lap portion, a second side edge adjacent to the active segment, a third side edge adjacent to the first side edge or the second side edge, and a fourth side edge adjacent to the first side edge or the second side edge;

wherein a distance from any point in the groove to the third side edge is greater than 1 micron, and a distance from any point in the groove to the fourth side edge is greater than 1 micron.

* * * * *